United States Patent
Yu et al.

(10) Patent No.: US 10,453,690 B2
(45) Date of Patent: Oct. 22, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guo Bin Yu, Shanghai (CN); Xiao Ping Xu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/834,843

(22) Filed: Dec. 7, 2017

(65) Prior Publication Data
US 2018/0166283 A1    Jun. 14, 2018

(30) Foreign Application Priority Data
Dec. 8, 2016    (CN) .......................... 2016 1 1125151

(51) Int. Cl.
| | |
|---|---|
| *H01L 21/265* | (2006.01) |
| *H01L 27/088* | (2006.01) |
| *H01L 29/08* | (2006.01) |
| *H01L 29/10* | (2006.01) |
| *H01L 29/66* | (2006.01) |
| *H01L 29/78* | (2006.01) |

(52) U.S. Cl.
CPC .... *H01L 21/26586* (2013.01); *H01L 27/0886* (2013.01); *H01L 29/0847* (2013.01); *H01L 29/1029* (2013.01); *H01L 29/1095* (2013.01); *H01L 29/66803* (2013.01); *H01L 29/785* (2013.01)

(58) Field of Classification Search
CPC ......... H01L 21/26586; H01L 29/66803; H01L 29/785; H01L 29/1095; H01L 27/0886; H01L 29/0847; H01L 29/1029
USPC ......................................................... 438/640
See application file for complete search history.

(56) References Cited

U.S. PATENT DOCUMENTS

| | | | |
|---|---|---|---|
| 2009/0017590 A1* | 1/2009 | Chen ................. | H01L 29/66833 438/287 |
| 2011/0057245 A1* | 3/2011 | Nagai ............... | H01L 21/28282 257/316 |
| 2011/0073919 A1 | 3/2011 | Pawlak | |
| | (Continued) | | |

FOREIGN PATENT DOCUMENTS

CN         105448660 A        3/2016

OTHER PUBLICATIONS

The European Patent Office (EPO) The Extended European Search Report for 17205931.3 dated May 17, 2018 20 Pages.

*Primary Examiner* — Caleb E Henry
(74) *Attorney, Agent, or Firm* — Anova Law Group, PLLC

(57) ABSTRACT

A semiconductor structure and a fabrication method are provided. The fabrication method includes providing a base substrate including a substrate and a plurality of discrete fins on the substrate; forming a support layer at least partially on sidewalls of the fins; ion implanting the fins through the (Continued)

support layer to form an ion doped region by an ion implantation process; removing the support layer to expose sidewalls of the fins.

19 Claims, 4 Drawing Sheets

(56) References Cited

U.S. PATENT DOCUMENTS

2015/0200291 A1* 7/2015 Alptekin ............... H01L 29/785
                                                      257/401
2015/0349094 A1    12/2015 Song et al.
2016/0322494 A1*  11/2016 Li ....................... H01L 29/7848

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201611125151.5, filed on Dec. 8, 2016, the entirety of which is incorporated herein by reference.

FIELD OF THE DISCLOSURE

The present disclosure generally relates to the field of semiconductor manufacturing technologies and, more particularly, relates to a semiconductor structure and a fabrication method thereof.

BACKGROUND

With the continuous development of integrated circuits toward ultra-large-scale integrated circuits, the circuit density of the integrated circuit keeps increasing, and more and more unit components are included, accompanied by a reduction of the unit component size. When the size of the MOS device decreases, the channel of the MOS device is also shortened. Since the channel is shortened, the shallow channel approximation of the MOS device is broken. As a result, various types of adverse physical effects (especially the short channel effect) begin to occur, which degrades the device performance and reliability and limits a further decrease of the device size.

To further reduce the size of MOS devices, a multi-faceted field-effect transistor structure has been developed to improve the controllability of the gate of MOS devices and to suppress the short channel effect. As a typical example, the popular fin-type field-effect transistor (FinFET) is a multi-faceted gate structure transistor.

The FinFET is a three-dimensional structure including a substrate and a plurality of discrete fins on the substrate, and isolating portions are located between the fins. The gate crosses over the fins and covers the top and sidewall surfaces of the fins. As this three-dimensional structure is very different from traditional planar transistor structure, the electrical performance of devices can be significantly influenced by even a portion of improper technical process.

The source, drain, and channel of the FinFET are all located within the fins, and the formation process of the fins can directly affect the performance of the formed transistor. However, conventionally formed semiconductor structures with fins usually have poor electrical performance and needs to be improved.

BRIEF SUMMARY OF THE DISCLOSURE

One aspect of the present disclosure includes a method for fabricating a semiconductor structure. The fabrication method includes providing a base substrate including a substrate and a plurality of discrete fins on the substrate; forming a support layer at least partially on sidewalls of the fins; ion implanting the fins through the support layer to form an ion doped region by an ion implantation process; and removing the support layer and exposing sidewalls of the fins.

Another aspect of the present disclosure includes a semiconductor structure. The semiconductor structure includes a base substrate, and the base substrate includes a substrate and a plurality of discrete fins on the substrate. The semiconductor structure also includes an ion doped region within the fins, and a support layer at least partially on sidewalls of the fins.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
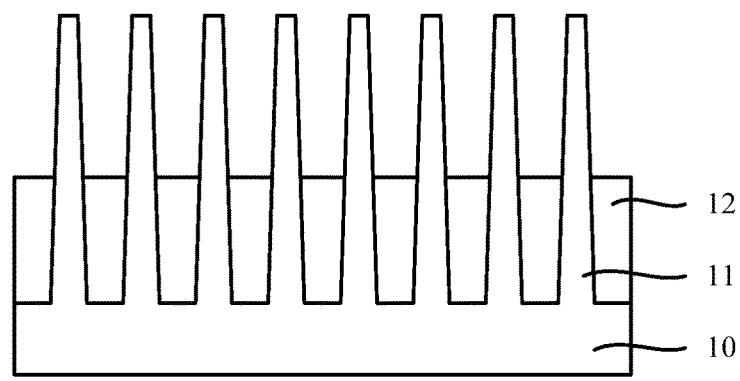
FIGS. 1~3 illustrate schematic structural section views of a semiconductor structure corresponding to certain stages of a fabrication process.
Figure 2:
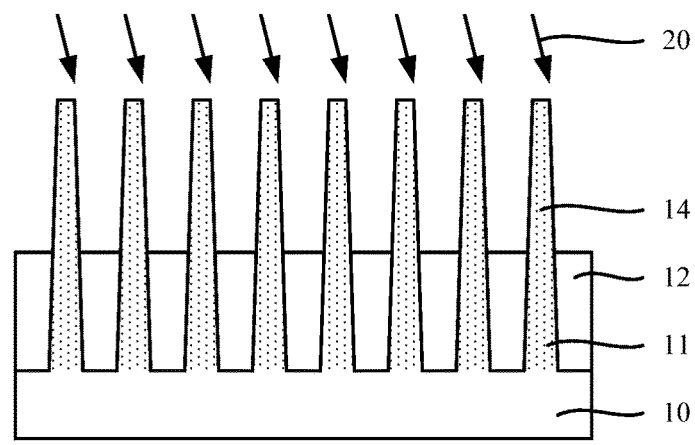
Figure 3:
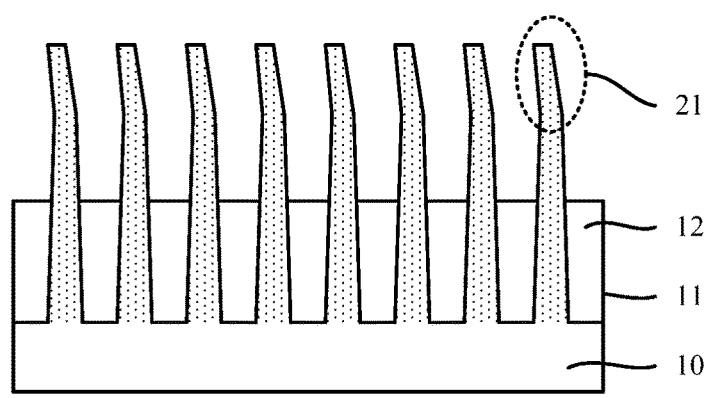

FIGS. 1~3 illustrate schematic structural section views of a semiconductor structure corresponding to certain stages of a fabrication process.

As shown in FIG. 1, a base substrate is provided and the substrate includes a substrate 10 and a plurality of discrete fins 11 on the substrate 10. An isolation layer 12 is formed on the portion of the substrate 10 that is exposed by the fins 11, and the isolation layer 12 exposes the top surface and a portion of the sidewall surface of the fins 11.

To make the formed fins 11 appropriate for forming various devices, the fins 11 need to be doped with ions, forming various doped regions within the fins 11, such as a well doped region, a pocket doped region, a lightly doped region or a source/drain region. As shown in FIG. 2, the fins 11 are ion implanted 20, and an ion doped region 14 is formed within the fins 11.

As shown in FIG. 3, because the processing temperature is relatively high during the ion implantation process 20, the fins 11 are softened and thus bent (as shown by Circle 21 in FIG. 3). However, when the ion implantation is carried out by a low-temperature process, since a seed layer is unable to form, the fins 11 will become amorphous. Both the bending and amorphousness of the fins 11 will affect the electrical performance of the fins 11, resulting in performance degradation of semiconductor structures.

In the disclosure, a base substrate is provided, and the base substrate includes a substrate and a plurality of discrete fins on the substrate. A support layer is formed on the sidewalls of the fins. The fins are then ion implanted to form an ion doped region.

In the present disclosure, a support layer is formed on the sidewalls of the fins after forming a substrate including fins and before ion implanting the fins. Because the support layer can support the fins during the ion implantation process, the bending of the fins during the ion implantation process is effectively reduced and the quality of the fins is improved, which is beneficial to the electrical performance of semiconductor structures.

Figure 6:
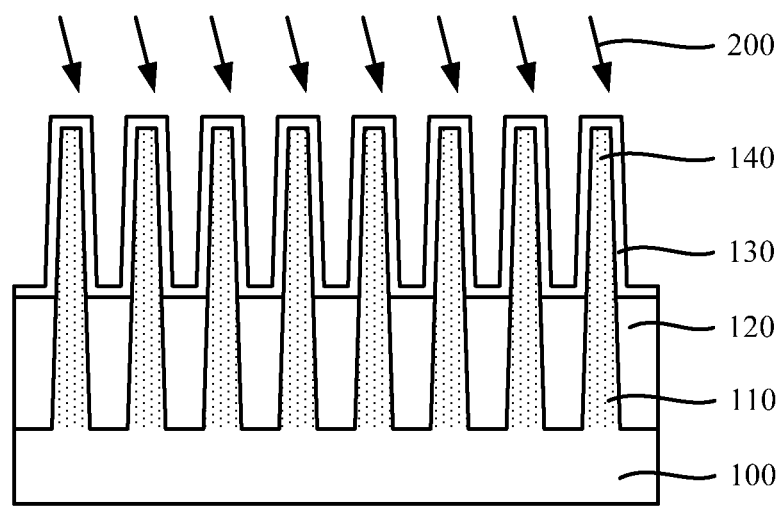
Figure 7:
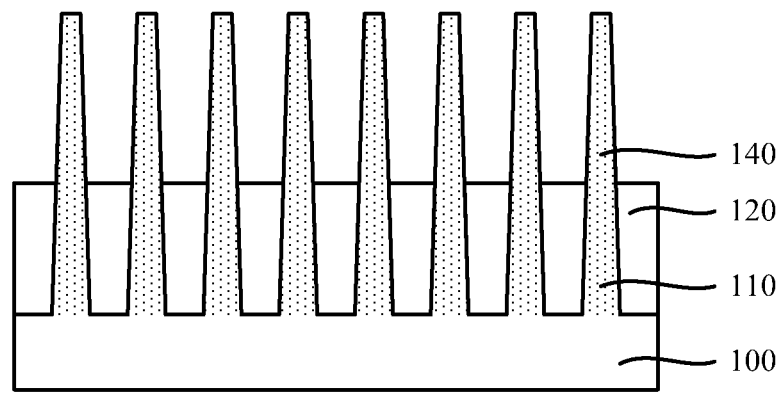
Figure 8:
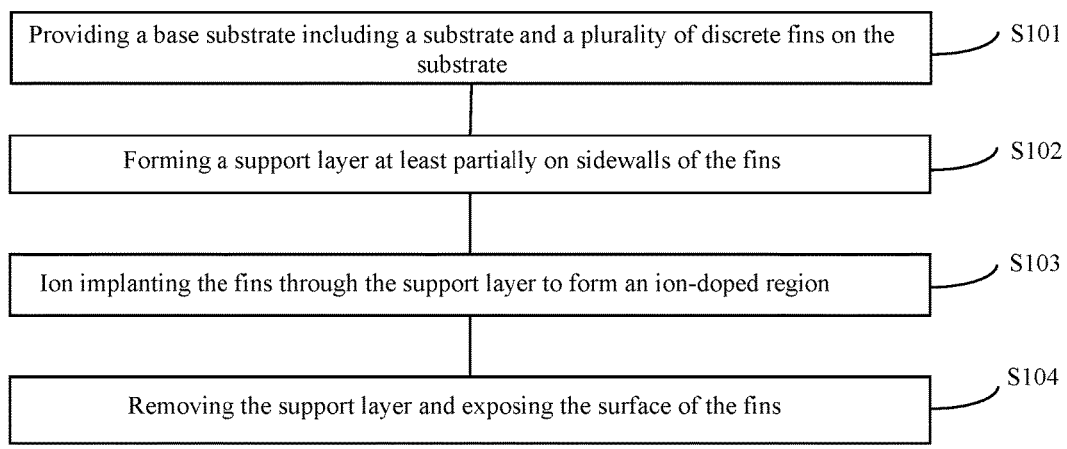
FIG. 8 illustrates an exemplary fabrication method of a semiconductor structure consistent with the disclosed embodiments.

FIG. 8 illustrates an exemplary fabrication process of a semiconductor structure consistent with the disclosed embodiments; and FIGS. 4~7 illustrate semiconductor structures corresponding to certain stages of the exemplary fabrication process consistent with various disclosed embodiments.

Figure 4:
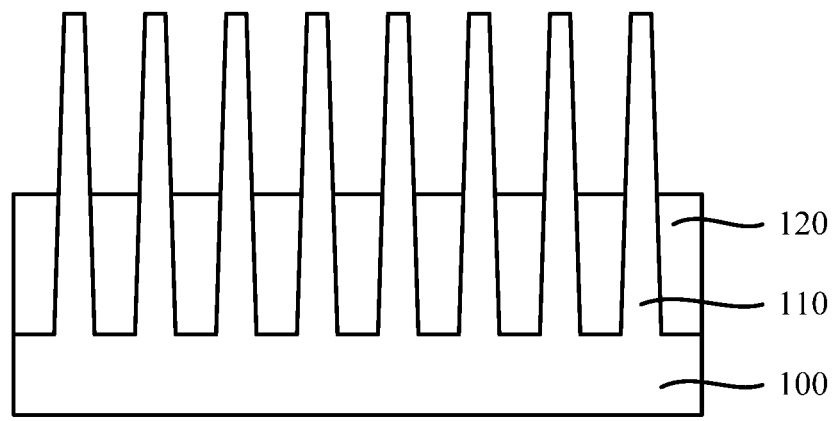
FIGS. 4~7 illustrate schematic structural section views of an exemplary semiconductor structure corresponding to certain stages of a fabrication method consistent with various disclosed embodiments.

As shown in FIG. 8, at the beginning of the fabrication process, a base substrate is provided (S101). As shown in FIG. 4, the base substrate includes a substrate 100 and a plurality of discrete fins 110 on the substrate 100. The substrate 100 is used to provide a processing platform.

In one embodiment, the substrate 100 is made of single crystal silicon. In other embodiments, the substrate may also be made of a polycrystalline silicon substrate, an amorphous silicon substrate, a germanium silicon substrate, a carbon silicon substrate, a silicon on insulator (SOI) substrate, a germanium on insulator (GOI) substrate, a glass substrate, or a Group III-V compound substrate, such as a gallium nitride substrate or a gallium arsenide substrate. The substrate may be made of any other appropriate material suitable for processing requirements or for easy integration.

The fins 110 are used to form FinFETs.

In one embodiment, the fins 110 and the substrate 100 are made of the same material, that is, single crystal silicon. In other embodiments, the fins may also be made of a different material from the substrate and may be made of a material suitable for forming fins, such as germanium, germanium silicon, carbon silicon, and/or gallium arsenide.

The substrate 100 and the fins 110 may be formed at the same time. The process of forming the substrate 100 and the fins 110 includes: providing an initial substrate; forming a fin mask layer (not indicated in the figure) on the surface of the initial substrate; etching the initial substrate using the fin mask layer as a mask to form the substrate 100 and the fins 110 on the substrate 100.

The fin mask layer is used to define the size and position of the fins 110. The process of forming the fin mask layer includes: forming a mask material layer on the initial substrate; forming a patterned layer on the mask material layer; using the patterned layer as a mask to etch the mask material layer and expose the initial substrate, forming a fin mask layer.

The patterned layer is used to pattern the mask material layer to define the size and position of the fins. In one embodiment, the patterned layer is a patterned photoresist layer, which can be formed by a coating process and a photolithography process. In other embodiments, the patterned layer may also be a mask formed by a multi-pattern masking process to reduce the feature size of the fins and the distance between adjacent fins and to increase the integration degree of the formed semiconductor structure. The multi-pattern masking process includes: a self-aligned double patterned (SaDP) process, a self-aligned triple patterned process, or a self-aligned double double patterned (SaDDP) process.

In one embodiment, after forming the substrate 100 and the fins 110, the fin mask layer at the top of the fins 110 is retained. The fin mask layer is made of silicon nitride and used to define the stop layer position of the planarization process in a subsequent process and to protect the fins 110.

In one embodiment, after forming the substrate 100 and the fins 110, the fabrication method further includes forming an isolation layer 120 on the portion of the substrate exposed by the fins 110. The top of the isolation layer 120 is lower than the top of the fins 110 and covers a portion of the sidewall surface of the fins 110.

The isolation layer 120 is used to achieve an electrical isolation between adjacent fins 110 and between adjacent semiconductor structures. In one embodiment, the isolation layer 120 is made of silicon oxide. In other embodiments, the isolation layer may also be made of any other appropriate material, such as silicon nitride or silicon oxynitride.

The process of forming the isolation layer 120 includes forming an isolation material layer on the portion of the substrate 100 exposed by the fins 110 by a chemical vapor deposition (e.g., fluid chemical vapor deposition) process, with the isolation material layer covering the fin mask layer; removing the portion of the isolation material layer that is higher than the fin mask layer by a chemical mechanical polishing process; and removing a partial thickness of the remaining isolation material layer by re-etching to form the isolation layer 120.

After forming the isolation layer 120, the fabrication method further includes removing the fin mask layer to expose the top surface of the fins.

Figure 5:
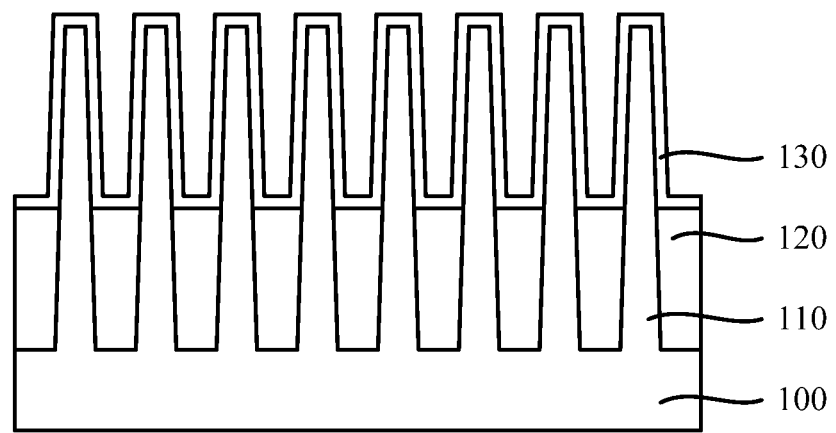

Returning to FIG. 8, after providing the substrate and the fins, a support layer is formed at least partially on sidewalls of the fins (S102). As shown in FIG. 5, a support layer 130 is formed on the sidewalls of the fins 110.

The support layer 130 is used to support the fins 110 in a subsequent process to suppress the bending of the fins 110 and improve the quality of the formed fins 110, such that the electrical performance of the formed semiconductor structure can be improved.

In one embodiment, the support layer 130 is a single layer structure during the process of forming the support layer 130. Specifically, the support layer 130 is made of silicon nitride (SiN). The silicon nitride material has a high density and a high hardness, and thus can effectively support the fins 110 during the subsequent process, thereby reducing the probability of bending.

In other embodiments, the support layer may also be made of one or more materials of silicon nitride (SiON), silicon oxide ($SiO_2$), alumina ($Al_2O_3$), zirconium oxide ($ZrO_2$), phosphorosilicate glass (PSG), and amorphous carbon (a-C).

In addition, in other embodiments, the support layer may also be a support layer in a multi-layer laminated structure. In particular, the support layer may be an oxide-nitride-oxide structure or a nitride-oxide-nitride structure. The use of a support layer in an oxide-nitride-oxide structure or a nitride-oxide-nitride structure does not require to add special processes. As such, the compatibility with the conventional technology is enhanced and the processing costs are reduced.

The thickness of the support layer 130 should neither be too large nor too small. If the thickness of the support layer 130 is too small, it is difficult for the support layer 130 to support the fins 110 effectively during the subsequent process, and the fins 110 may still be bent; If the thickness of the support layer 130 is too large, it may cause material waste and the processing difficulty may be enhanced. The subsequent process involves an ion implantation process of the fins 110, and hence if the thickness of the support layer 130 is too large, the ion implantation process of the fins 110 will be adversely affected, thereby adversely affecting the electrical performance of the formed semiconductor structure. In one embodiment, the thickness of the support layer 130 is in the range of approximately 10 Å to 200 Å during the process of forming the support layer 130.

In particular, the process of forming the support layer 130 includes forming the support layer 130 by an atomic layer deposition process. The layer formed by the atomic layer deposition process has a high density and desirable step coverage. By using the atomic layer deposition process to form the support layer 130, it is advantageous to increase the density of the support layer 130 and the step coverage performance, such that the yield and performance of semiconductor structures can be improved.

In other embodiments, the process of forming the support layer further includes forming the support layer by a furnace tube or a chemical vapor deposition process. As shown in FIG. 5, in one embodiment, the support layer 130 is located on the sidewalls of the fins 110, on the top surface of the fins 110, and on the portion of the substrate 100 between the fins 110. In one exemplary embodiment, the process of forming the support layer 130 includes forming a support layer 130 on the top and sidewall surfaces of the fins and on the surface of the isolation layer 120 by an atomic layer deposition process.

In other embodiments, the support layer 130 may also be located only on the sidewalls of the fins 110. The process of forming the support layer on both the sidewall and top surfaces of the fins and on the portion of the substrate between the fins can simplify the process and reduce the process cost.

Returning to FIG. 8, after forming the support layer, the fins are ion implanted through the support layer to form an ion doped region (S103). As shown in FIG. 6, an ion doped region 140 is formed within the fins by ion implanting the fins 200. The ion implantation process 200 is used to form an ion doped region 140 within the fins 110.

Since the support layer 130 is formed on sidewalls of the fins 110, even if the fins 110 are softened when increasing the temperature during the ion implantation process 200, the support layer 130 can still effectively support the fins 110. As such, the possibility of bending of the fins 110 is reduced, which is beneficial to the electrical performance of the formed semiconductor structure.

In one embodiment, the ion implantation process 200 includes a source/drain implantation process, and the ion doped region 140 is a source/drain doped region. The ion implantation process 200 involves ion implantation of the fins 110 to form a source/drain doped region within the fins 110.

In other embodiments, the ion implantation process may also include a well implantation process, a pocket implantation process, or a light doped drain implantation process (LDD). In other words, the ion implantation process further includes: ion implanting the fins to form a well doped region within the fins; or ion implanting the fins to form a pouch doped region within the fins; or ion implanting the fins to form a lightly doped region within the fins. In other embodiments, the ion implantation process may also be an ion implantation process for forming other doped regions.

During the ion implantation process 200, the processing temperature should neither be too low nor be too high. If the processing temperature is too low, the seed layer on the surface of the fins 110 will be affected, causing amorphousness of the fins 110, such that the quality of the fins 110 and the performance of the formed semiconductor structure will be affected. If the processing temperature is too high, the processing risk will be increased, causing an energy waste and an increase of the processing difficulty. Specifically, the processing temperature is in a range of approximately 20° C. to 30° C. during the ion implantation process 200.

For example, the ion implantation process 200 may be performed at room temperature (about 25° C.). Since a support layer 130 is formed on the sidewalls of the fins 110 and the processing temperature of the ion implantation process 200 is relatively high, the amorphousness possibility of the fins 110 is reduced, thereby effectively improving the quality of the fins 110 and the electrical performance of the semiconductor structure.

In addition, because a support layer 130 is formed on the top and sidewall surfaces of the fins 110, the doping ions need to penetrate the support layer to enter into the fins 110 to achieve implantation during the ion implantation process. The energy and dose of the ion implantation process 200 need to be adjusted as the support layer 130 forms.

In one embodiment, the ion implantation process 200 includes a source/drain implantation process. In other words, the ion implantation process 200 involves ion implantation (200) of the fins 110 to form a source/drain doped region within the fins 110.

During the ion implantation process 200, the implantation dose is in a range of approximately 1 E13 atom/cm$^2$ to 5 E15 atom/cm$^2$, the implantation energy is in a range of approximately 2 KeV to 60 KeV, and the angle between the implantation direction and the normal direction of the ion implantation is in a range of approximately 0° to 30°.

After the ion implantation process 200, other processes such as forming a gate structure are also needed, and the formation of the support layer 130 may affect the subsequent process.

Returning to FIG. 8, after the ion implantation process, the fabrication method further includes removing the support layer and exposing the surface of the fins (S104). As shown in FIG. 7, after the ion implantation process 200, the support layer 130 is removed to expose the surface of the fins 110.

In one embodiment, the support layer 130 covers the top and sidewall surfaces of the fins 110 and the surface of the isolation layer 120. Therefore, the process of removing the support layer 130 includes removing the support layer 130 and exposing the top and sidewall surfaces of the fins 110 and the surface of the isolation layer 120.

In one embodiment, the process of removing the support layer 130 includes removing the support layer 130 by a wet etching process. By using a wet etching process to remove the support layer 130, the damage to the fins 110 can be effectively reduced during the removing process, such that the possibility of damaging the ion doped region 140 is reduced and the yield and performance of the semiconductor structure are improved.

When forming the support layer 130, the support layer 130 is made of silicon nitride. The process of removing the support layer 130 by a wet etching process includes removing the support layer 130 by a phosphoric acid wet etching process.

In the process of removing the support layer 130 by a phosphoric acid wet etching process, the mass percentage of the phosphoric acid solution is in a range of approximately 50% to 90%, the processing temperature is in a range of approximately 0° C. to 180° C., and the processing time is in a range of approximately 60 s to 3 min. The effect of removing the support layer 130 by a wet etching process on the fins 110 can be effectively reduced by setting the processing parameters of the phosphoric acid wet etching process in a reasonable range, such that the adverse effect of the support 130 layer on the semiconductor structure is suppressed, and the yield and electrical performance of the formed semiconductor structure are improved.

Accordingly, the present disclosure also provides a semiconductor structure.

FIG. 6 illustrates a schematic cross-sectional view of an embodiment of the semiconductor structure consistent with the disclosure.

The semiconductor structure includes a substrate and a plurality of discrete fins 110 on the substrate 100, an ion-doped region 140 within the fins 110, and a support layer 130 at least on partial sidewalls of the fins 110.

The substrate 100 is used to provide a processing platform. In one embodiment, the substrate 100 is made of single crystal silicon. In other embodiments, the substrate may also be made of a polycrystalline silicon substrate, an amorphous silicon substrate, or a germanium silicon substrate, a carbon silicon substrate, a silicon on insulator (SOI) substrate, a germanium on insulator (GOI) substrate, a glass substrate, or a Group III-V compound substrate, such as a gallium nitride substrate or a gallium arsenide substrate. The substrate may be made of any other appropriate material suitable for processing requirements or for easy integration.

The fins 110 are used to form FinFETs. In one embodiment, the fins 110 are made of the same material with the substrate 100, that is, the single crystal silicon. In other embodiments, the fins may be made of a different material from the substrate and may be made of an appropriate material suitable for forming fins, such as germanium, germanium silicon, carbon silicon, and/or gallium arsenide.

In one embodiment, the semiconductor structure further includes an isolation layer 120 located on the portion of the substrate 100 exposed by the fins 110. The isolation layer 120 is used to achieve electrical isolation between adjacent fins 110 and between adjacent semiconductor structures. In one embodiment, the isolation layer 120 is made of silicon oxide. In other embodiments, the isolation layer may also be made of any other appropriate material, such as silicon nitride and/or silicon oxynitride.

The ion doped region 140 is formed by an ion doping process. In one embodiment, the ion doped region 140 is a source/drain doped region. In other embodiments, the ion doped region may also be a well doped region, a pocket doped region, or a lightly doped region. In particular, the doping depth of the doped region 140 is in a range of approximately 10 nm to 80 nm.

The support layer 130 is used to support the fins 110 during the formation of the ion doped region 140, thereby reducing the probability of bending of the fins 110, improving the quality of the fins 110 and the electrical performance of the semiconductor structure.

In one embodiment, the support layer 130 is a single-layer structure. Specifically, the support layer 130 is made of silicon nitride (SiN). The silicon nitride material has a high density and a high hardness, and thus can effectively support the fins 110 during the subsequent process, thereby reducing the probability of bending.

In other embodiments, the support layer may also be made of one or more materials of silicon nitride (SiON), silicon oxide ($SiO_2$), alumina ($Al_2O_3$), zirconium oxide ($ZrO_2$), phosphorosilicate glass (PSG), or amorphous carbon (a-C).

In addition, in other embodiments, the support layer may also be a support layer of a multi-layer laminated structure. In particular, the support layer may be an oxide-nitride-oxide structure or a nitride-oxide-nitride structure.

The thickness of the support layer 130 should neither be too large nor too small. If the thickness of the support layer 130 is too small, it is difficult for the support layer 130 to support the fins 110, and the fins 110 may still be bent; If the thickness of the support layer 130 is too large, it may cause material waste and increase the processing difficulty. As a result, the processing difficulty of forming the ion doped region 140 is increased and the performance of the semiconductor structure is affected. In particular, in one embodiment, the thickness of the support layer 130 is in a range of approximately 10 Å to 200 Å.

In one exemplary embodiment, when forming a FinFET device, a SiN support layer may be added at least partially on sidewalls of the fins before the ion implantation process and removed after the ion implantation process. Since the SiN support layer is a hard layer, the fins can keep vertical after the ion implantation process. Therefore, the electrical performance of the semiconductor structure is improved.

Compared with conventional technologies, the device and its fabrication method in the present disclosure provide the following advantages.

For example, a support layer is formed at least partially on sidewalls of the fins after forming a base substrate including fins and before the ion implantation of the fins. Since the support layer can support the fins during the ion implantation process, it is possible to effectively reduce the bending of the fins during the ion implantation process and to improve the quality of the fins, which is beneficial to the electrical performance of the semiconductor structure.

In an alternative embodiment of the present disclosure, the ion implantation process is performed after forming the support layer and the ion implantation process can be performed at room temperature. Because a support layer is formed on the sidewalls of the fins and the processing temperature of the ion implantation process is very high, it is possible to effectively reduce the amorphousness possibility of the fins, such that the quality of the fins and the electrical performance of semiconductor structures are improved.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
   providing a base substrate including a substrate and a plurality of discrete fins on the substrate;
   forming a support layer at least partially on sidewalls of the fins, wherein the support layer is a multi-layer structure including an oxide-nitride-oxide structure or a nitride-oxide-nitride structure; and
   ion implanting the fins through the support layer to form an ion doped region by an ion implantation process;
   removing the support layer and exposing the sidewalls of the fins after the ion implanting the fins; and
   forming a gate structure on the plurality of discrete fins after removing the support layer.

2. The method according to claim 1, wherein:
   the support layer is a single layer structure or a multi-layer laminated structure.

3. The method according to claim 1, wherein:
   the support layer is made of one or more of silicon nitride, silicon oxynitride, silicon oxide, aluminum oxide, zirconium oxide, phosphosilicate glass, and amorphous carbon.

4. The method according to claim 1, wherein:
   a thickness of the support layer is in a range of approximately 10 Å to 200 Å.

5. The method according to claim 1, wherein:
the support layer is formed by an atomic layer deposition process, a furnace tube process, or a chemical vapor deposition process.

6. The method according to claim 1, wherein the ion implantation process includes at least one of:
forming a well doped region within the fins;
forming a pocket doped region within the fins;
forming a lightly doped region within the fins; and
forming a source/drain doped region within the fins.

7. The method according to claim 1, wherein the ion implantation process includes:
a processing temperature in a range of approximately 20° C. to 30° C.

8. The method according to claim 1, wherein the ion implantation process includes forming a source/drain doped region within the fins using:
an implantation dose in a range of approximately 1 E13 atom/cm$^2$ to 5 E15 atom/cm$^2$;
an implantation energy in a range of approximately 2 KeV to 60 KeV; and
an angle between an implantation direction and a normal direction of the substrate in a range of approximately 0° to 30°.

9. The method according to claim 1, wherein removing the support layer includes:
a wet etching process.

10. The method according to claim 9, wherein:
the support layer is made of silicon nitride; and
the support layer is removed by a phosphoric acid wet etching process.

11. The method according to claim 10, wherein removing the support layer by the phosphoric acid wet etching process includes:
a mass percentage of the phosphoric acid solution in a range of approximately 50% to 90%;
a processing temperature in a range of approximately 0° C. to 180° C.; and
a processing time in a range of approximately 60 seconds to 3 minutes.

12. The method according to claim 1, wherein:
the support layer is formed on a top surface of the fins and on the substrate between the fins.

13. The method according to claim 1, further comprising:
forming an isolation layer between the plurality of discrete fins on the substrate, wherein the support layer is formed on the isolation layer covering the sidewalls of the fins and exposing a top surface of the plurality of discrete fins.

14. A semiconductor structure, comprising:
a base substrate including a substrate and a plurality of discrete fins on the substrate;
an ion doped region in the fins; and
a support layer at least partially on sidewalls of the fins, wherein
the support layer is a multi-layer structure including an oxide-nitride-oxide structure or a nitride-oxide-nitride structure, and
the plurality of discrete fins on the substrate are converted to ion doped regions by an ion implantation process on the plurality of discrete fins through the support layer.

15. The semiconductor structure according to claim 14, wherein:
the support layer is a single layer structure or a multi-layer laminated structure.

16. The semiconductor structure according to claim 14, wherein:
the support layer is made of one or more of silicon nitride, silicon oxynitride, silicon oxide, aluminum oxide, zirconium oxide, phosphosilicate glass, and amorphous carbon.

17. The semiconductor structure according to claim 14, wherein:
the support layer includes an oxide-nitride-oxide structure or a nitride-oxide-nitride structure.

18. The semiconductor structure according to claim 14, wherein:
a thickness of the support layer is in a range of approximately 10 Å to 200 Å.

19. The semiconductor structure according to claim 14, wherein:
the ion doped region is at least one of a well doped region, a pocket doped region, a lightly doped region, and a source/drain doped region.

* * * * *